US012112886B2

(12) United States Patent
Varney et al.

(10) Patent No.: US 12,112,886 B2
(45) Date of Patent: Oct. 8, 2024

(54) QUENCH PROTECTION ARRANGEMENT

(71) Applicant: OXFORD INSTRUMENTS NANOTECHNOLOGY TOOLS LIMITED, Oxon (GB)

(72) Inventors: Andrew Varney, Oxon (GB); Andy Twin, Oxon (GB); Dave Warren, Oxon (GB); Roman Viznichenko, Oxon (GB)

(73) Assignee: OXFORD INSTRUMENTS NANOTECHNOLOGY TOOLS LIMITED, Oxon (GB)

( * ) Notice: Subject to any disclaimer, the term of this patent is extended or adjusted under 35 U.S.C. 154(b) by 174 days.

(21) Appl. No.: 17/640,495

(22) PCT Filed: Sep. 21, 2020

(86) PCT No.: PCT/GB2020/052282
§ 371 (c)(1),
(2) Date: Mar. 4, 2022

(87) PCT Pub. No.: WO2021/058940
PCT Pub. Date: Apr. 1, 2021

(65) Prior Publication Data
US 2022/0351888 A1    Nov. 3, 2022

(30) Foreign Application Priority Data

Sep. 23, 2019 (GB) .................... 1913695

(51) Int. Cl.
*H01F 6/02* (2006.01)
*G01R 33/38* (2006.01)
(Continued)

(52) U.S. Cl.
CPC .......... *H01F 6/02* (2013.01); *G01R 33/3804* (2013.01); *H01C 1/08* (2013.01); *H01C 7/12* (2013.01)

(58) Field of Classification Search
CPC ......... H01F 6/02; G01R 33/3804; H01C 1/08; H01C 7/12; H01C 13/02; Y02E 40/60; H02H 7/001
(Continued)

(56) References Cited

U.S. PATENT DOCUMENTS 6,147,844 A * 11/2000 Huang .................. H02H 7/001
361/19
7,492,556 B2 * 2/2009 Atkins ............... G01R 33/3815
361/19
(Continued)

FOREIGN PATENT DOCUMENTS

CN 107221401 A * 9/2017 ............... H01F 6/00
CN 112509780 A * 3/2021 ............... H01F 6/00
(Continued)

OTHER PUBLICATIONS

English Translation of Japanese Office Action received in corresponding patent application No. 2022-517285, mail date Jul. 1, 2024.

*Primary Examiner* — Dharti H Patel
(74) *Attorney, Agent, or Firm* — Blank Rome LLP

(57) ABSTRACT

A quench protection arrangement for a superconducting magnet is disclosed. The arrangement comprises: a superconducting magnet comprising a plurality of magnet sections; a plurality of varistors, wherein each of the plurality of varistors is electrically connected in parallel across a respective one of the plurality of magnet sections; and a heater arrangement electrically connected to the plurality of varistors and configured to apply heat to each of the plurality of magnet sections in response to a change in a voltage across any one or more of the plurality of varistors. A method of protecting a superconducting magnet is also disclosed.

12 Claims, 5 Drawing Sheets

(51) Int. Cl.
*H01C 1/08* (2006.01)
*H01C 7/12* (2006.01)

(58) Field of Classification Search
USPC .......................................................... 361/19
See application file for complete search history.

(56) References Cited

U.S. PATENT DOCUMENTS

| | | | |
|---|---|---|---|
| 2005/0068701 A1* | 3/2005 | Lee .................. | H02H 7/001 361/19 |
| 2011/0069418 A1* | 3/2011 | Huang ............... | H02H 7/001 361/19 |
| 2012/0250205 A1* | 10/2012 | Pfitzer ............... | H02H 9/041 361/91.1 |
| 2018/0248363 A1* | 8/2018 | Ren .................. | H01F 38/023 |

FOREIGN PATENT DOCUMENTS

| | | | | | |
|---|---|---|---|---|---|
| CN | 112908608 A | * | 6/2021 | ............... | H01F 6/00 |
| CN | 109193597 B | * | 9/2022 | ............. | H02H 9/023 |
| CN | 114221298 B | * | 11/2023 | ................ | H01F 6/00 |
| EP | 1876609 A1 | | 1/2008 | | |
| EP | 3014634 B1 | | 3/2020 | | |
| GB | 2422958 A | * | 8/2006 | ......... | G01R 33/3815 |
| GB | 2495968 A | * | 5/2013 | ............. | H01J 23/16 |
| GB | 2514372 B | | 4/2016 | | |
| JP | 2011-071515 A | | 4/1999 | | |
| JP | 2004-186524 A | | 7/2004 | | |
| JP | 2005-353777 A | | 12/2005 | | |
| JP | 11-102808 A1 | | 4/2011 | | |

* cited by examiner

QUENCH PROTECTION ARRANGEMENT

CROSS REFERENCE TO RELATED APPLICATIONS

This application is a U.S. national stage application based on International Application No. PCT/GB2020/052282, filed Sep. 21, 2020, which claims priority to Great Britain Patent Application No. 1913695.1, filed Sep. 23, 2019, both of which are herein incorporated by reference in their entirety.

FIELD OF THE INVENTION

The present invention relates to a quench protection arrangement. In particular the invention relates to a quench protection arrangement for a superconducting magnet, the arrangement comprising a plurality of varistors connected across respective ones of a plurality of sections of a superconducting magnet.

BACKGROUND TO THE INVENTION

A quench in a superconductor, in particular a superconducting magnet, is a sudden loss of superconductivity therein and occurs when a part of a magnet coil reverts to a normal, resistive state. Various conditions can cause a quench to occur, typically an excessive field, or rate of change thereof, inside the magnet, or a physical defect. The resulting rapid, localised Joule heating at the part of the coil that has ceased to be superconductive, which is caused by the high current continuing to flow at that location, in turn raises the temperature of the surrounding regions. Consequently those regions are caused to enter a normal, resistive state as well, and thus a heating chain reaction is produced whereby the temperature across the entire magnet is raised above the superconductivity threshold and the magnet reverts to a normal state.

When a quench occurs, the sudden decrease of current can result in inductive voltage spikes and arcing. Magnets and other components can be damaged by these high-voltage and heating effects. Additionally, with "wet" magnets that are maintained at their low operating temperatures by a cryogenic fluid, such as liquid helium bath magnets, the rapid conversion into heat of the large amount of energy that was stored in the magnet while it was operating as a superconductor causes a sudden, potentially explosive boil-off of the cryogenic fluid. Moreover, with these "wet" magnets the aforementioned boil-off of fluid can create an asphyxiation hazard.

A quench occurring will cause the flowing current to be reduced owing to the increased resistance in the coil. The current typically falls slowly, however, as the quench may take several seconds to propagate, depending on the size of the coil. Additionally, magnet sections typically operate in series connection with one or more other sections, and in such cases if only one section quenches, the inductance of the other magnets will generate a voltage directed so as to maintain the current, which can cause the energy stored in those connected magnet sections, as well as the one in which the quench occurred, to be dumped in the latter.

It is known to equip superconducting magnets with safety devices adapted to stop or limit the current as soon as possible after the quench occurs, and to avoid the unwanted and potentially damaging concentration of heat energy within a quenched magnet by way of spreading or dissipating the generated heat to the greatest extent possible throughout the magnet section and other magnet sections connected thereto. A known approach for achieving this spreading effect is to initiate, when a quench is detected in a magnet coil, quenches in the other coils by way of heating them deliberately.

The use of resistors and diodes across inductive, superconducting magnet sections is a known approach for quench protection. The resistors are ordinarily made of NiCr, stainless steel, or another resistive material that has linear voltage-versus-current properties at a given temperature. In such existing protection systems, a quench is propagated through the coil sets completely passively by means of mutual inductance and circulation of current into the resistors. This may be referred to as a 'passive' protection approach.

The initiation of a quench can be effected by the rate of change of current or reaching the critical current in each section. In some systems a heater network is used to initiate quenches in adjacent coils to expedite the quench. This may be referred to as a 'passive with heater' approach. The heaters are driven by the voltages that are produced across the resistors over the section in which a quench has occurred, and/or one of the other protected sections of the magnet.

Alternatively, a quench can be detected externally and, in response, a capacitive or battery discharge can be caused which is used to fire, that is trigger or drive, heaters within the magnet. This type of protection may be referred to as 'active'.

Existing solutions for quench protection suffer from a number of drawbacks. For instance, when conventional resistors are used in protection arrangements with high field magnets, if an excess current passes through those resistors, they may melt and fail with an open circuit, with the possibility of electrical arcing to earth and between parts of the magnet in an uncontrolled manner. In such scenarios damage may be caused to the magnet. Moreover, voltages across magnet sections may take a long period to build (around 100 ms typically), which limits the responsiveness of protection provided by passive and passive with heater arrangements.

There exists a need for an improved way of protecting against quenches in superconducting magnets, for example by driving heaters in 'passive with heater' systems more effectively, by further increasing and expediting energy dissipation, and by providing improved protection for compact, high-field and high-current density magnets in particular.

SUMMARY OF THE INVENTION

In accordance with a first aspect of the invention there is provided a quench protection arrangement for a superconducting magnet, the arrangement comprising: a superconducting magnet comprising a plurality of magnet sections; a plurality of varistors, wherein each of the plurality of varistors is electrically connected in parallel across a respective one of the plurality of magnet sections; and a heater arrangement electrically connected to the plurality of varistors and configured to apply heat to each of the plurality of magnet sections in response to a change in a voltage across any one or more of the plurality of varistors.

The inventors have realised that varistors may be employed advantageously in cryogenic environments and in particular can be used to provide improved protection against magnet quench. Varistors are electronic components with an electrical resistance that varies according to an applied voltage, generally having a decreasing resistance with increasing current. FIG. 1A shows a comparison between the current-voltage relation of a varistor and that of a fixed, or linear, resistor. Varistors may thus be understood as voltage-dependent, non-linear electrical components. They can generally be characterised as having a high electrical resistance at lower voltages, which decreases with increasing voltage as alluded to above. The response may be understood as generally following a sigmoidal curve. These components are commonly used in other technical fields as voltage surge limiters. It has been found that varistors may be employed advantageously in protection circuits with low-temperature superconductor (LTS) or high-temperature superconductor (HTS) magnet sections. Such arrangements can produce higher voltages and currents across a varistor at the start of the magnet quench. This effect can be used to drive a quench heater for coils adjacent, or otherwise positioned to be able to apply heat in order to expedite quench, to a quenching coil or to alter the current distribution between magnet sections in order to expedite the quench across the entire magnet. In this way, the propagation of a quench throughout a magnet may be effected more rapidly using the arrangement than with conventional resistor-based arrangements. Thus the arrangement can more reliably and responsively cause a quench to be spread through an entire magnet and thereby mitigate the harmful effects of highly localised heating. Advantageously, the rapid dissipation of energy throughout the magnet that is facilitated by the varistor arrangement may reduce coil hotspots produced when a quench occurs. The term "voltage" as used in this disclosure may be understood as referring to an electric potential difference. That is, the voltage across a varistor can be understood as the potential difference across it.

As noted above, an important implication of using varistors is that, typically, at a low current, the voltage across the varistor will be relatively high while remaining within prescribed limits at maximum current flow. The performance of a varistor with respect to current can be approximated by the relation $V=CI^\beta$ where V is the voltage across it, $\beta$ is the non-linearity parameter and C is the resistance with a current of 1 A flowing through it. These parameters are typically different at different operating temperatures for any given material. As an order of magnitude guide, at room temperature, a varistor comprising a silicon carbide (SiC) material may typically have $\beta\sim0.5$, and a varistor comprising a zinc oxide material (ZnO) might have a typical non-linearity parameter value of $\beta\sim0.05$. Preferably one or more of the plurality of varistors is selected on the basis of its non-linearity and resistance properties, typically quantified by its values for the $\beta$ and C parameters.

By way of illustration, FIGS. 1B and 2 show characteristic voltage-current graphs for a varistor with $\beta=0.5$, $C=15$ compared to a 1$\Omega$ linear resistor. In FIG. 1B, the response across the whole range of interest is plotted. Assuming that the maximum permitted voltage across the protected magnet section is 250 V, this corresponds to a current flow of 250 A in the case where a 1$\Omega$ linear resistor is used. The voltage across the chosen varistor would be within the voltage limit at this current. In FIG. 2, an expanded portion of the curve is shown at lower currents. In this region, the voltage across the varistor is higher than it would be across the resistor with the same current flowing through it. A 'passive' quench heater might need 100 V in order to activate reliably, this voltage being reached at a current of less than 50 A for the varistor, whereas it can be seen that a current of 100 A would be required to be flowing through a 1$\Omega$ resistor in order to achieve this.

The change in the voltage that results in the application of heat to the magnet may, in various embodiments and configurations, be a positive-going or negative-going change in the voltage value. Typically the arrangement is adapted to apply the heat based upon the voltage change meeting a predetermined condition, which is preferably that the magnitude of the change in the voltage, that is the absolute value of the difference between the value from which the voltage changed and the value to which it changes, meets or exceeds a configured or predetermined threshold difference value.

In some preferred embodiments, the heater arrangement is configured to apply heat in response to a voltage across any one or more of the plurality of varistors reaching a threshold value. In this way, the change may be such that the voltage across the section becomes equal to, or passes, the threshold value. Typically this comprises the magnitude of the voltage exceeding the threshold value, or its magnitude, since these values may be positive or negative as noted above.

Arrangements as described in this disclosure can advantageously rely on the particular manner in which the voltage across a varistor changes when a quench occurs in the magnet section across which it is connected to heat the magnet, or some other part of the magnet, in order to mitigate the quench occurring in the initial section. This can, in principle, be achieved by way of a single heater. However, in preferred embodiments the heating arrangement comprises multiple heaters. More preferably, the heater or heaters are arranged so as to maximise the distribution of heat around the superconducting magnet as a whole, or at least a portion of it in which a quench is to be induced by heating. In some embodiments, therefore, the heater arrangement comprises a plurality of heaters, wherein each heater of the plurality of heaters is positioned for applying, or is configured to apply in use, heat to a respective one of the plurality of magnet sections. Providing each magnet section with a respective heater configured to activate upon a quench occurring in any of the sections enables the energy within the magnet to be dissipated more quickly and effectively.

Some preferred embodiments may be understood as being similar to the above-described "passive with heater" protection scheme. Thus, in some embodiments the heater arrangement is configured to generate heat to be applied to each of the plurality of magnet sections by way of Joule heating as a result of the voltage change across the said one or more of the plurality of varistors. Driving the heaters passively, via a current being generated or increased through one or more heaters connected to the protection circuit including the varistors retains the above-noted benefits of passive schemes while also achieving, by way of the varistors, dramatic improvement to the responsiveness of the arrangement to a quench in any part of the magnet.

Typically, the varistor connected across each of the magnet sections is provided as a single varistor component. In preferred embodiments, however, one or more of, or all of, the plurality of varistors each comprises two or more varistor components. That is, each varistor component in such embodiments is individually a varistor, and those components are together, in those applications, configured to operate in a group serving as a varistor across a given magnet section. Each of these compound varistors comprising multiple varistor components may, in various embodiments, contain two, three, four, five, or more, or any number of such components. The number of varistor components in each varistor may be the same or different for any two of the plurality of varistors in the arrangement, for example this being dependent upon the structure of the superconducting magnet coils to which they relate.

Where varistors containing multiple varistor components grouped together are used, it may be advantageous to provide the grouped components in the form of a stack. Preferred embodiments include these varistor components having a stackable geometry, such as a tile, plate, or disc, for instance, therefore. In some preferred embodiments, each varistor component is formed as a disc, and for each of one or more varistors that comprise two or more of the said varistor components, the varistor components are arranged in a stack.

Additionally, or alternatively, to utilising varistors to activate a passive-with-heater protection circuit, active protection circuits can also benefit from a voltage response to a quench across a varistor. In particular, the use of varistors and their ability to produce rapid voltage increases when quenches occur is useful for active schemes since the voltage change may be used as a signal or trigger to activate a protection device or system that is driven, powered, or configured externally rather than being driven by the current resulting from the voltage change.

Thus in some embodiments, the arrangement further comprises an active quench protection system that comprises: a quench detector module configured to detect a quench occurring in one or more of the plurality of magnet sections based upon a voltage across one or more of the plurality of varistors connected across the one or more of the plurality of magnet sections reaching a predetermined quench threshold voltage value, which may be the same as or different from the threshold voltage value mentioned previously. The active quench protection system may further comprise a quench inducer system configured to effect a quench condition in one or more of the plurality of magnet sections in response to the quench detector module detecting a quench occurring. This arrangement is advantageous in that threshold voltages can be reached more rapidly by way of employing varistors, meaning that these active protection schemes, which vary in the ways that they induce a quench throughout a magnet as explained further below, can be triggered more quickly.

A particular benefit of the rapid rise of voltage across the varistors is that, in the event of a quench at a magnet current which is low in proportion to the magnet operating current, the voltage across one or more of the varistors in the protection circuit may rise above the trigger level for the active quench, whereas in the case of conventional resistor protection the voltage would be below this level and the heater circuit would not trigger. It is understood generally that a "low" current in this context typically corresponds to a current that is less than half the magnet operating current. In some embodiments employing an active protection system, therefore, the arrangement may be configured such that a quench occurring in one or more of the plurality of magnet sections while the magnitude of the electrical current through the magnet sections is less than 50% of a predetermined current value corresponding to an operating current of the magnet causes the voltage across the one or more of the plurality of varistors to reach the predetermined quench threshold voltage value. In this way, such arrangements extend the quench protection, compared with conventional approaches. This can be achieved by way of the arrangements, and in particular the varistor, being configured such that the voltage condition for triggering active protection is met at current levels that are lower than those for which a resistor-based protection arrangement would be activated. In some preferred embodiments, the arrangement may be configured such that the said voltage reaches the predetermined quench threshold voltage value when the said current magnitude is less than 40%, 30%, 20%, or 10% of the said operating current.

The arrangements described in this disclosure may be used to protect various types of superconducting magnets. In addition to low temperature superconductor (LTS) magnets, hybrid magnets that include high temperature superconductor (HTS) parts as well as LTS parts generally require alternative or additional arrangements in order to protect the HTS sections effectively. Although some embodiments might employ the same manner of quench protection for both types of superconductor coil, typically quench protection methods applied to LTS are not necessarily applicable to, or particularly effective in protecting, HTS magnet sections.

The HTS vs LTS "stability margin", which may be understood as the minimum quench energy density, is typically three orders of magnitude greater for HTS than for LTS coils. This is explained, for example, at Section 6.2.6 of Iwasa, "Case Studies in Superconducting Magnets", Springer (Second Edition, 2009), with reference especially to Table 6.4. This means that a magnet wound from an HTS conductor is typically much more stable against disturbances than LTS windings, and less likely to quench.

While the HTS windings may not quench, it is not necessarily the case that the HTS magnet sections cannot be damaged. Damage is possible especially in magnets wherein the HTS part is arranged as an insert within or housed, in use, within an LTS magnet. Typically in such configurations, as the current in the LTS windings decays away, an increased current is caused in the HTS windings owing to inductive coupling according to Lenz's Law. One possible damage mechanism is that the resulting additional stress overstrains the magnet windings.

The greater stability also means that it is considerably more difficult to instigate a quench for protecting the magnet using the arrangements or schemes typically applied to LTS magnets. In addition, if a quench is induced locally in an HTS coil, it is less likely to propagate through the conductor windings, for the same reason. An inappropriately applied local heater could therefore have the unwanted effect of producing a hot spot, in principle leading to overheating damage in the HTS.

In order to address these differences, alternative arrangements have been used for protecting both HTS magnets and HTS windings comprised by hybrid magnets. There are many examples of different HTS protections schemes which are triggered based on a voltage signal or change detection, or another indication that the magnet has quenched. One example is opening a switch to dissipate the energy from the coils externally to the magnet. Another example is actively applying alternating current so as to induce heating in the winding bulk, rather than locally at the surface of the coil. An arrangement according to the latter example is explained in EP 3014634 B1, referred to therein as "Coupling Loss Induced Quench".

Existing arrangements for protecting HTS magnets and magnet parts can be employed in some embodiments in which an LTS/HTS hybrid superconducting magnet is to be protected. In such embodiments, the superconducting magnet sections comprise at least one Low Temperature Superconductor, LTS, magnet section and at least one High Temperature Superconductor, HTS, magnet section, and wherein the quench protection arrangement comprises an HTS quench protection system adapted to apply quench protection to each of the at least one HTS magnet section in response to a voltage across any one or more of the plurality of varistors reaching a threshold voltage value. As alluded to above, typically the HTS section is arranged in use as an insert within LTS magnet sections. Various configurations for combining the HTS insert part of the magnet with the LTS part—which may be referred to as an 'outsert'—may be used. For example, the LTS and HTS parts can be energized separately using two respective power supplies, which may be different such they can operate at different currents for instance. The two parts can, in some embodiments, be connected in series to run off a single power supply, and can be operated at the same current. Other configurations are also possible, and may involve inductive coupling to energize the sections. The HTS system typically uses a voltage condition as a trigger for effecting techniques for protecting HTS sections specifically, when a quench occurs in any of the magnet sections.

As noted above, the HTS quench protection system is adapted to apply the quench protection by way of any one or more of: causing energy to be dissipated from the at least one HTS magnet section to a body external to the magnet; and applying an alternating current having a predetermined frequency and magnitude configured to cause Joule heating within a coil of the at least one HTS magnet section. The energy may be caused to be dissipated by opening a switch to transfer energy from the coils to an external, connected component.

In various embodiments, different types of varistors may be used in connection across the magnet sections, including the types mentioned earlier in this disclosure. Preferably, owing to their properties, the arrangement includes a silicon carbide (SiC) varistor. More preferably, one or more, or a subset, of the plurality of varistors comprises silicon carbide, and more preferably still each of the plurality of varistors comprises silicon carbide.

The varistor comprised by the arrangement is, in some preferred embodiments, a high-energy silicon carbide varistor. Such components typically comprise silicon carbide, generally in the form of grains, usually dispersed or otherwise disposed within a matrix formed from one or more binders and/or additives. Typically the matrix is formed from a clay material. Each varistor typically has the form of a disc comprising the said material(s) with electrical contacts typically attached thereto.

Typically the varistors are selected in accordance with particular characteristics that are desired for a given application, including any of the voltage, current, and energy properties of the varistor. Additionally, varistors may be selected on the basis of the degree of non-linearity of the resistance of the component. This non-linearity is typically quantified in terms of a beta value of the varistor.

Additionally, varistors may be challenged close to their component failure rating due to the failure mode of short circuit in a localised area in the disc of a typical varistor according to the present protection arrangement. The robust material composition of varistors according to typical embodiments is retained beneficially at cryogenic environments, which typically permits a magnet test to complete without arcing to ground and subsequent damage to the magnet coil.

A variety of SiC varistors are suitable for use in the present arrangement. The inventors have found, surprisingly, that the use of varistors, which have been used conventionally in room temperature applications, in cryogenic environments may allow quench protection arrangements to be provided that provide a number of advantages compared with existing protection systems. The varistor and other components of the arrangement, such as a protection circuit and/or a heater circuit, are typically configured to operate in a cryogenic environment.

Advantageously, the arrangement may facilitate the incorporation of protection circuits utilising the unique properties of varistors to expedite quench in a number of ways.

The arrangement may be beneficial by virtue of involving a high voltage at low currents but lower voltage at higher currents, which may reduce the risk of damage being caused to a magnet, whilst maximising the current density in the varistors (which typically remain more level when compared with a conventional resistor circuit). Typically, an initially high voltage for lower currents, and a subsequent fall in resistance, mean that it is possible to configure the varistors in such a way that high current build up in a magnet section is avoided.

Additionally, in some embodiments the voltage from the varistor may be used to drive a heater more efficiently, in particular in terms of the speed with which a quench may be initiated in one or more in other coils. This may also improve the reliability of the heater in different quench scenarios since the heater voltage is typically self-limiting to some degree at least.

Preferably the varistor is configured such that voltage clamping occurs. Thus a safe voltage may be maintained, whereby the magnet coils are protected, regardless of excessive current. The sizes of SiC grains comprised by one or more varistors may be selected so as to optimise the clamping voltage and/or current density.

Moreover, 'active' protection circuits preferably have larger section voltages initially, and this typically enables more rapid triggering (positive and negative) on a set voltage threshold.

In some embodiments, a combination of both an active protection circuit and a 'passive with heater' arrangement, each being varistor-based as described above, is beneficial. For magnets comprising both LTS and HTS components, for example, such a combination is particularly valuable as it enables two different protection schemes to be applied to the components to which they are best suited. This is discussed in greater detail below.

In some preferred embodiments, the varistor is connected in series with back-to-back diodes across the protected magnet sections. The arrangement may include a protection circuit designed to draw more current and, in particular, to fire heaters in a 'passive with heaters' scenario. The advantageous properties of the varistor that have been found are utilised beneficially in these embodiments.

Passive quench protection may also be provided in an improved manner by the arrangement, in particular in cryogenic conditions such as at $T=4.2$ K, and in this way may provide fail safe operation.

As has been explained earlier in this disclosure, a key advantage that may be achieved by the described arrangements is that a quench arising in a given magnet section can be propagated more quickly to other magnet sections. This is achieved by providing, as part of the arrangement, a protection circuit to which a heater or heaters connected in such a way as to apply heat rapidly across the entire magnet are connected. Preferably, the heater arrangement is associated with the plurality of varistors such that, when a quench occurs in one of the plurality of magnet sections, a resulting voltage across the said varistor causes the heating arrangement to provide heat to at least one further magnet section of the plurality of magnet sections.

According to a second aspect of the invention there is provided a method of protecting a superconducting magnet comprising a plurality of magnet sections in which each of a plurality of varistors is electrically connected in parallel across a respective one of the plurality of magnet sections, and a heater arrangement is electrically connected to the plurality of varistors, the method comprising applying heat to each of the plurality of magnet sections in response to a change in a voltage across any one or more of the plurality of varistors.

BRIEF DESCRIPTION OF THE DRAWINGS

Examples of the present invention will now be described, with reference to the accompanying drawings, in which.

DESCRIPTION OF EMBODIMENTS

Quench modelling has been performed in order to demonstrate the capabilities of varistors in quench protection arrangements. For simplicity, and in view of the propensity for more complex modelled scenarios to render less clear the effect of the varistors or lead to systematic modelling errors, a simple, two-coil design has been used to test the concept. This is for illustrative purposes only, and it is envisaged that the quench protection arrangement may be implemented with any number of magnet coils. Computer software has been used to model the coil configuration and quench modelling.

Figure 1A:
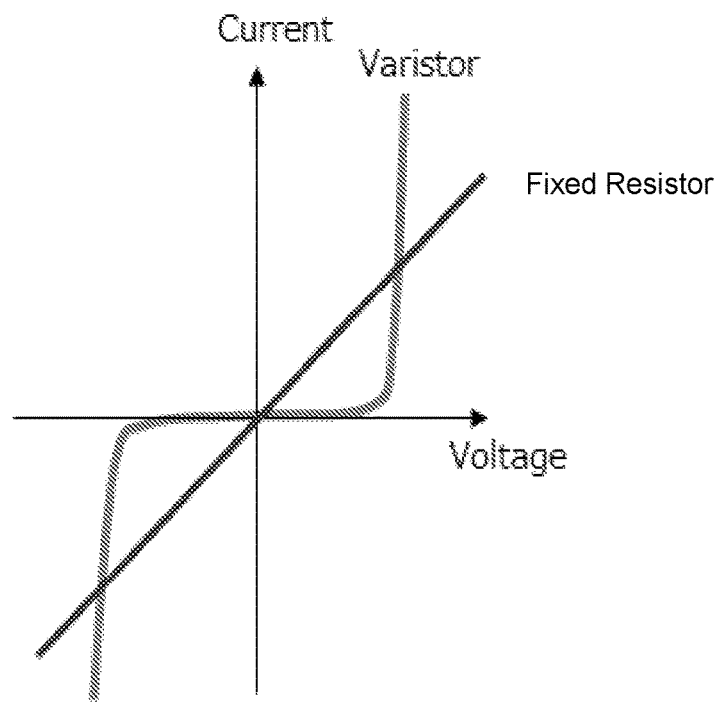
FIGS. 1A and 1B are line graphs respectively illustrating the properties of a typical varistor in comparison with a typical linear resistor, and the characteristics of an exemplary varistor compared to those of a resistor over a range of interest.
Figure 1B:
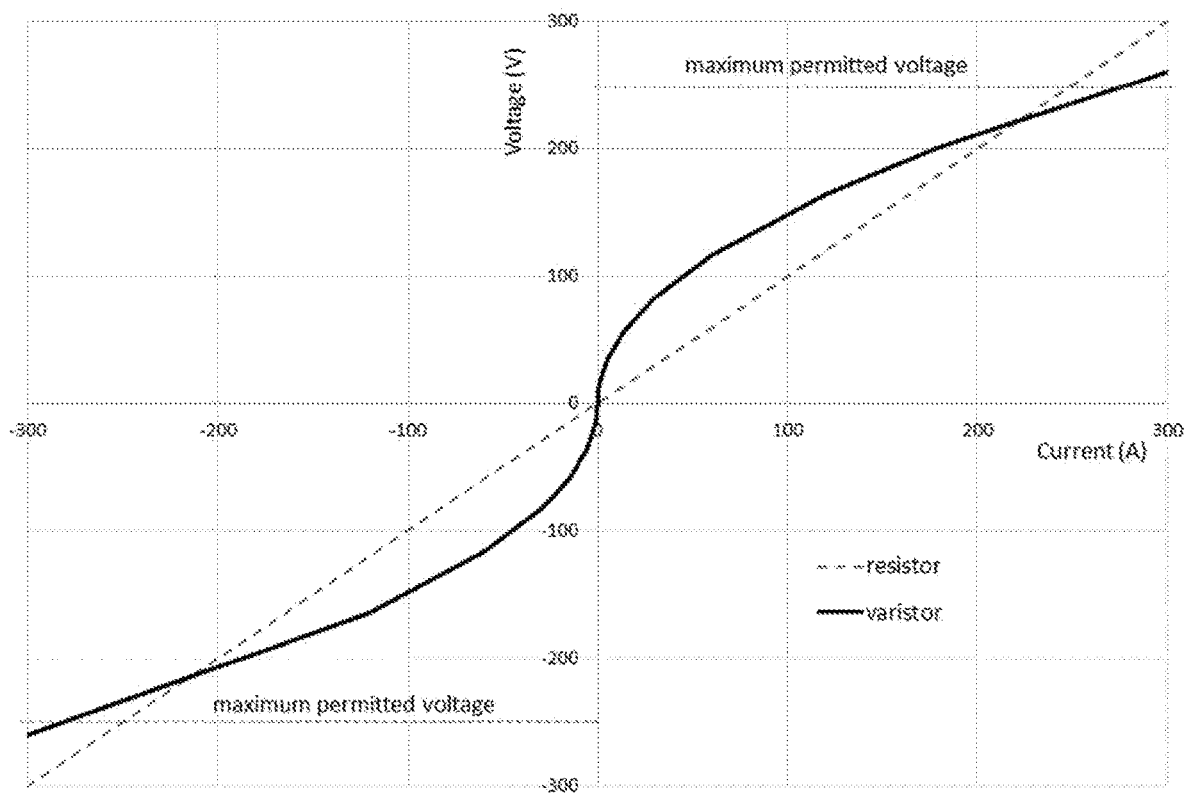
Figure 2:
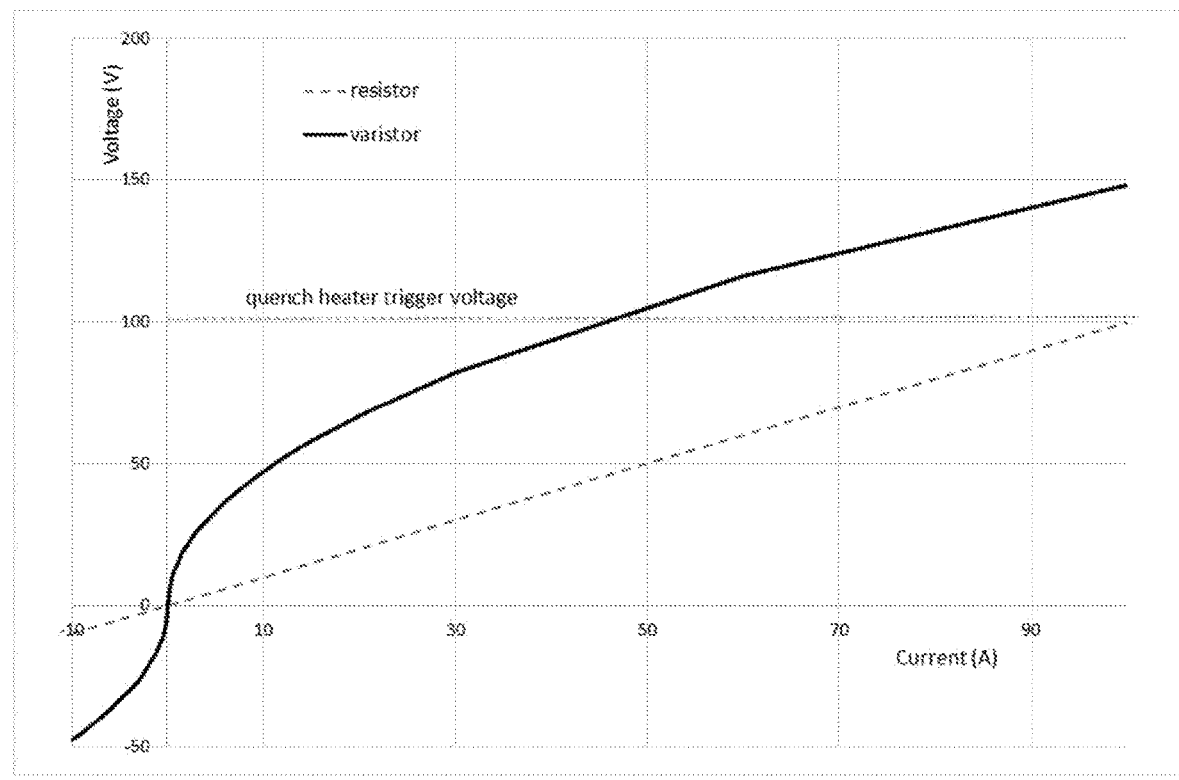
FIG. 2 is a line graph comparing varistor and linear resistor characteristics at lower currents.
Figure 3:
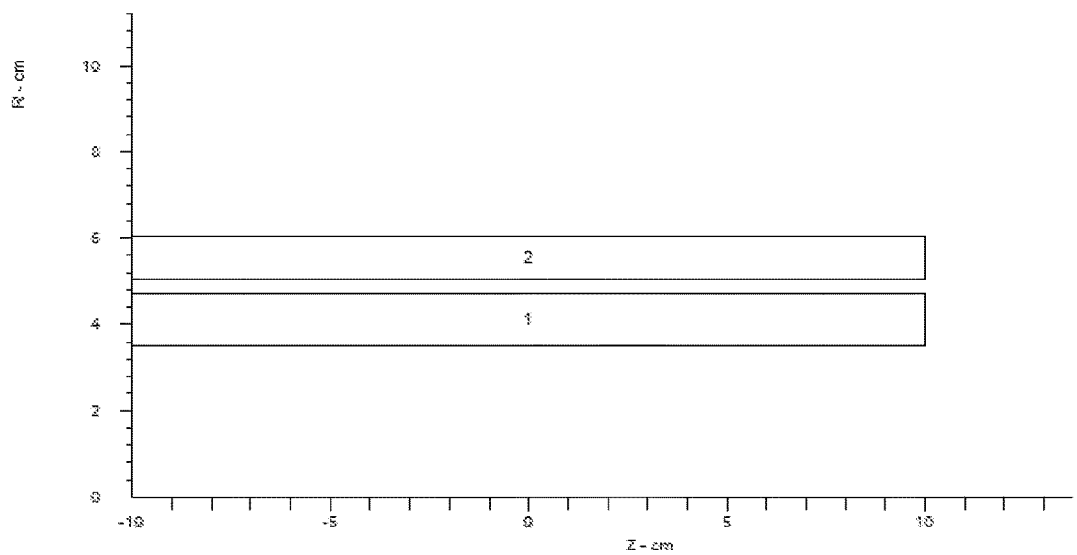
FIG. 3 is a schematic illustration of a cross-section through a magnet test coil used to model quench behaviour with varistors being used in place of resistors in a magnet quench protection arrangement.

FIG. 3 shows a cross-section through one half of the cylindrical coils as modelled in this general example. The coils are shown as cylindrical blocks centred on R=0 (corresponding to the y axis in the figure) and extending in the z direction (parallel with the x axis in the figure). Both coil 1 and coil 2 consist of NbTi wire of the same size and the coils have been chosen to have comparable resistance and inductance for simplicity and for comparison of the quench modelling results with approximate theoretically-derived analytical calculations. The varistor parameters used have been derived from experimental measurements of their voltage-current characteristics at cryogenic temperatures. The superconducting wire and other material properties as well as the other internal model parameters used have been long established and used reliably in the quench model computer program during magnet design and for analysis of magnet test results.

The effect of varistor-based quench protection on the derived voltage across the quenching section has been demonstrated by way of modelling a quench starting in coil 2. The case where the magnet is protected using varistors in place of resistors has been found to result in a significantly faster rise in voltage compared to the case where the quenching section is protected with a conventional resistor. Based on the data visualised in FIG. 4, it can be seen that a quench heater may be triggered approximately 50 ms earlier by using the appropriate varistors in the protection circuit, rather than resistors.

In order to demonstrate the effect of using varistors on the maximum over-currents induced in coils in a quench, a model has been run in which both of the modelled coils are quenching. The results are thus illustrative of the case where quench heaters have been triggered across all coils. This would also approximate the case if the effects from the coil in which the quench initiated could be used to induce a quench in the other coils very soon after the first coil starts to quench.

The model showed that the peak current in the slowest quenching section was much reduced when the magnet was protected with varistors, compared to the magnet protected with conventional resistors. Based on the data visualised in FIG. 5, the peak over-current could be reduced by more than half by using the appropriate varistors in the protection circuit instead of the conventional resistors.

Figure 4:
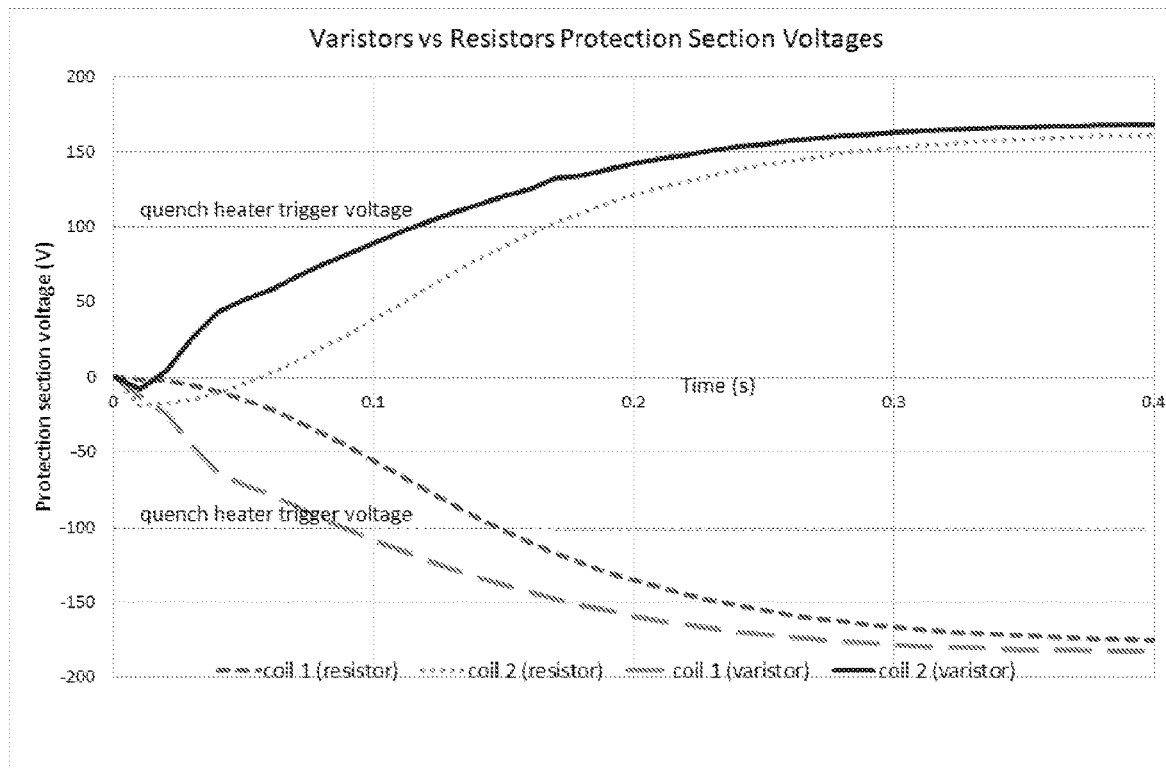
FIG. 4 is a line graph showing a comparison of modelled coil voltages across a two-section magnet with a quenching section being protected with a varistor as well as it being protected by a fixed resistor.
Figure 5:
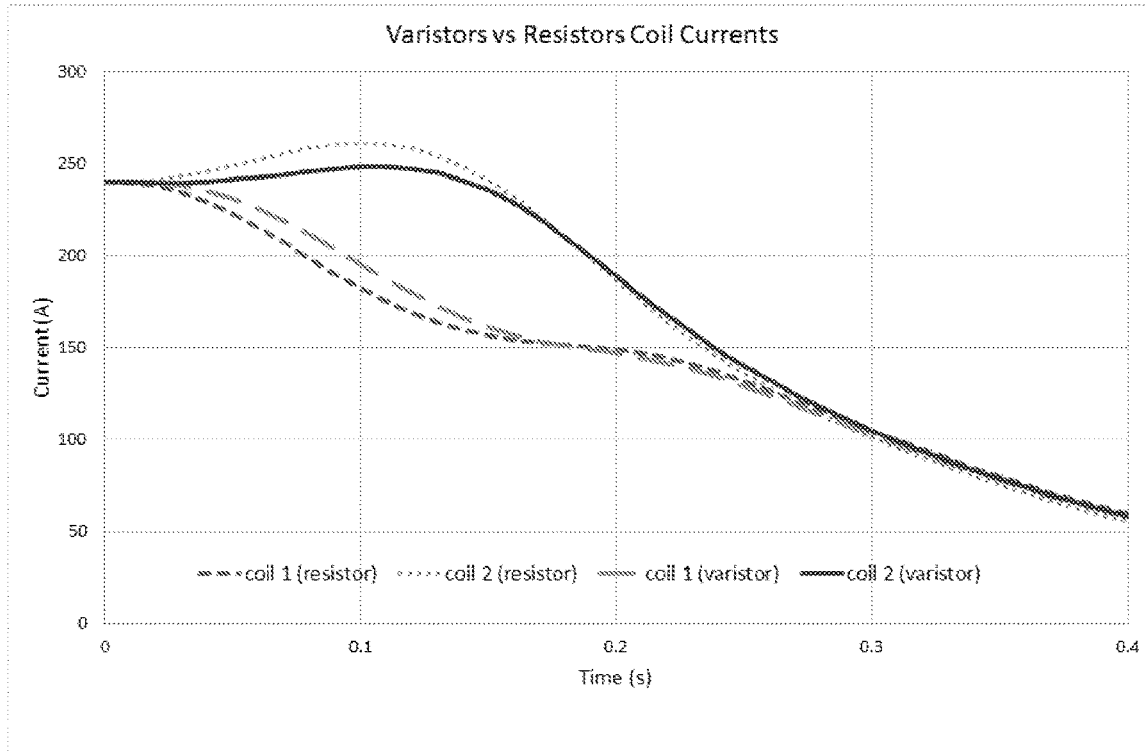
FIG. 5 is a line graph plotting modelled coil currents through a magnet in which both coils are quenching, and showing the currents when the magnet is protected with varistors and when it is protected with linear resistors.

The illustrative output from the quench modelling is shown in FIGS. 4 and 5.

Examples of quench protection arrangement employing the principles demonstrated by the quench modelling are now described.

In some examples, the varistors are preferably connected in series with "back-to-back" diodes across the protected magnet sections, with the derived voltage used to activate heaters in the 'passive with heaters' scenario described above. Protection schemes such as those described in GB 2514372 B are suitable for being implemented as a means of protecting magnet coils in response to a voltage change across a varistor.

Figure 6:
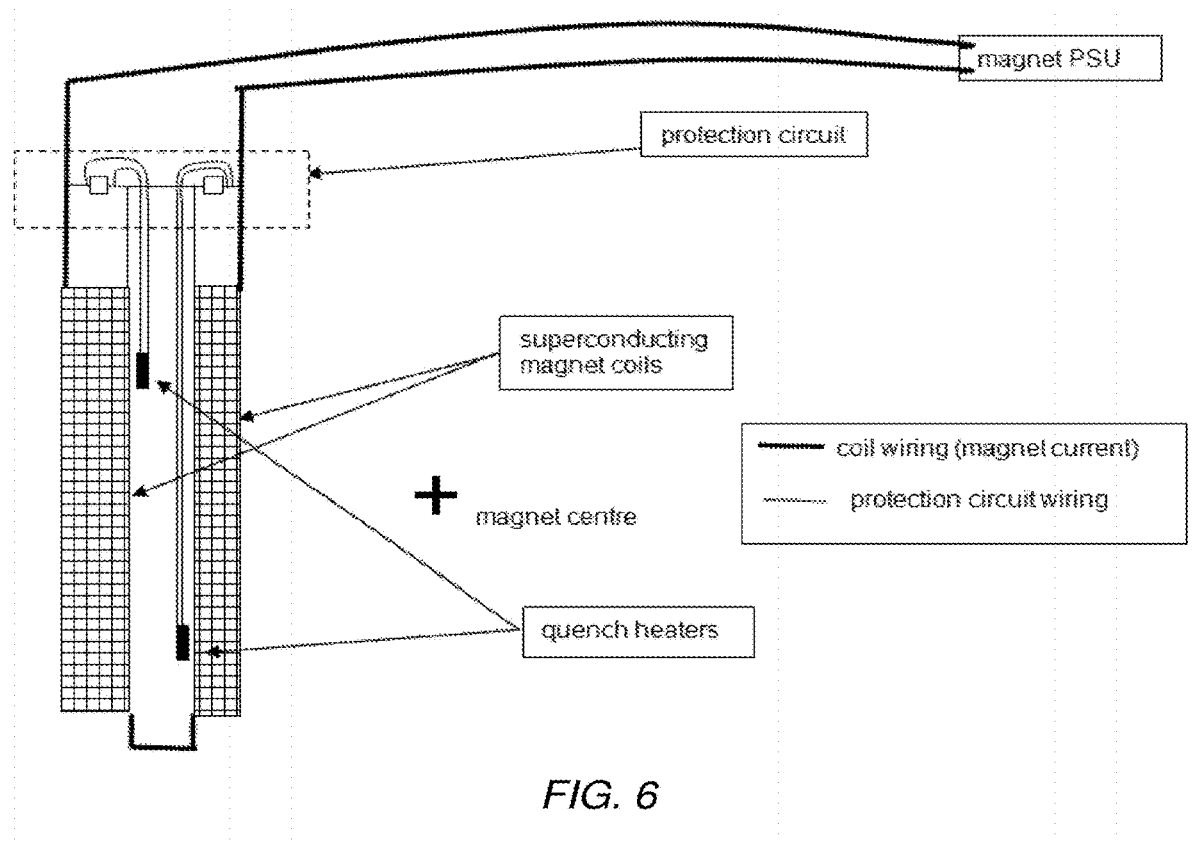
FIG. 6 is a schematic diagram of an example protection arrangement, illustrating the protection circuit in relation to the superconducting magnet circuit, wherein the magnet shown is a simplified example having only two coil sections.

FIG. 6 is a schematic representation of a first example arrangement, in which, for simplicity, a magnet having only two coil sections is shown. Applications of the arrangement are envisaged to include significantly more protected magnet coil sections than this simplified example.

Figure 7:
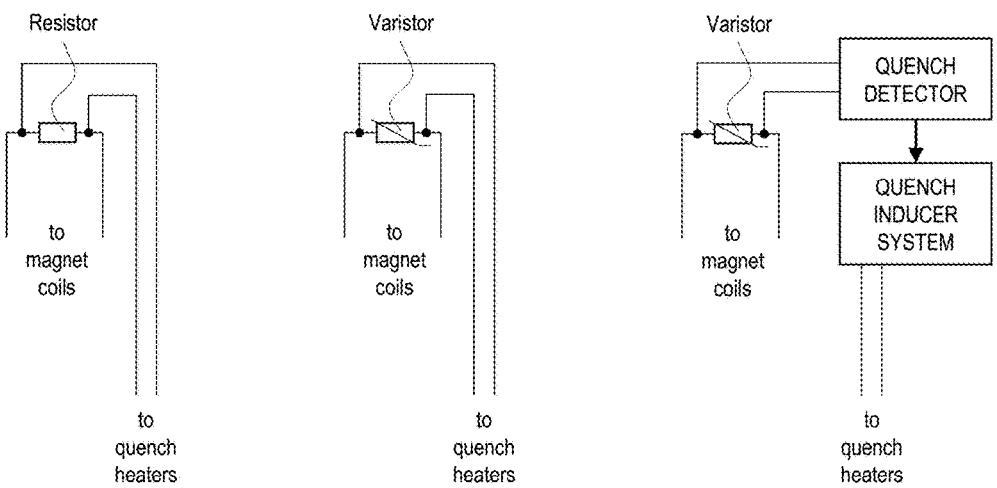
FIG. 7 is a schematic drawing including a comparison of a protection circuit for a protection arrangement according to the invention, across one protected coil section together with an equivalent circuit according to the prior art.

FIG. 7 shows a schematic representation of a circuit according to the prior art comprising linear resistors at the left of the figure, together with an example passive protection circuit comprising varistors at the center of the figure and an example active protection circuit comprising varistors, a quench detector module, and a quench inducer system at the right of the figure.

Figure 8:
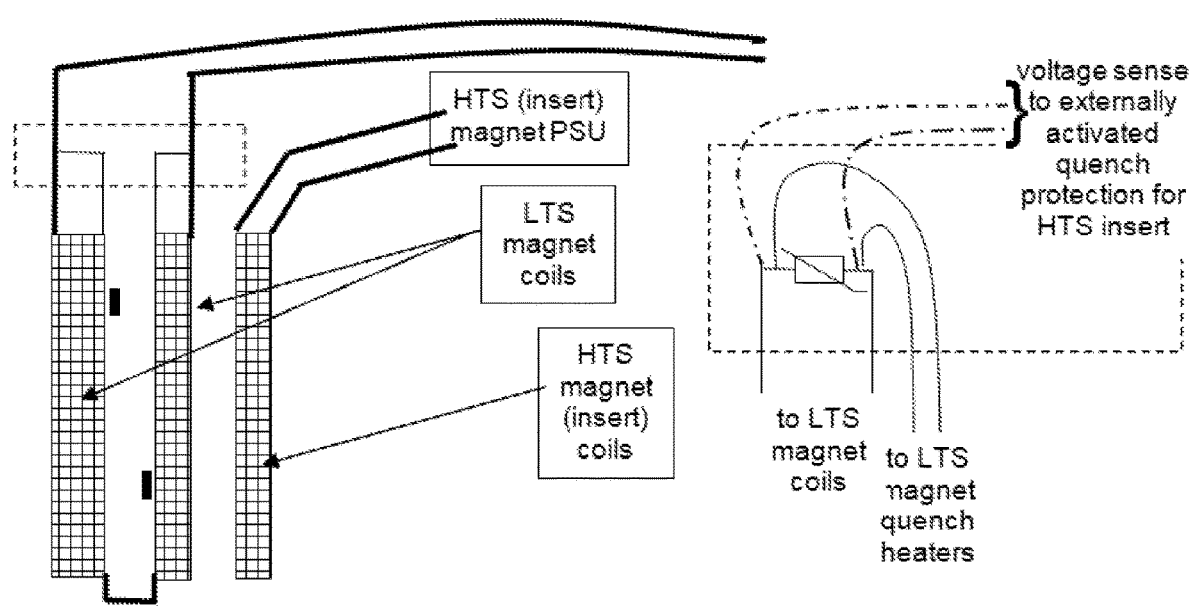
FIG. 8 is a schematic diagram showing an example arrangement and protection circuit according to the invention wherein internally activated quench heaters on an LTS magnet are combined with a trigger for externally activated quench protection for an HTS insert in the magnet.

In a further example, which is particularly suited to protecting magnets including an LTS magnet with an HTS insert, different protection schemes are used for the LTS coils and HTS coils respectively. These two magnet parts may run in parallel, using separate power supplies, or may run in series. This example employs the same 'passive with heaters' scheme for protecting the LTS section as the previous example arrangement. In addition, the arrangement is configured to detect, more rapidly than would be possible with prior art arrangements, the voltage change across the LTS magnet protection elements in order to activate a quench protection scheme externally for the HTS magnet. Such a combination of protection schemes for these hybrid-type magnets is alluded to above. FIG. 8 shows schematically the additional elements involved in this example.

Details of example SiC varistors and superconducting magnet quench protection arrangements comprising them are now described.

As noted above, varistor properties can be characterized by the relation $V=CI^\beta$. The "beta value", $\beta$, defining the degree of nonlinearity of the varistor affects the speed of discharge. This can be modified by way of dopants in the material of the varistor, and process adjustments.

Some example varistors are semiconductor devices manufactured from SiC particles in a clay matrix, to produce a disc or tile.

Failure-mode testing of an example arrangement has been carried out, in liquid nitrogen and involving increasing the energy to more than five times that for which the device was at room temperature. It was found that a non-propagating hotspot formed on the varistor disc, which failed via short circuit and continued to pass current. This is a particularly useful attribute for magnet protection. The SiC material of the example varistor maintained its integrity in cryogenic conditions, and with material optimisation it is envisaged that further examples may provide effective replacements for linear dump resistors.

The invention claimed is:

1. A quench protection arrangement for a superconducting magnet, the arrangement comprising:
    a superconducting magnet comprising a plurality of magnet sections;
    a plurality of varistors, each electrically connected in parallel across a respective one of the plurality of magnet sections, wherein one or more of the plurality of varistors each comprises two or more varistor components; and
    a heater arrangement electrically connected to the plurality of varistors and configured to apply heat to each of the plurality of magnet sections in response to a change in a voltage across any one or more of the plurality of varistors.

2. An arrangement according to claim 1, wherein the heater arrangement is configured to apply heat in response to a voltage across any one or more of the plurality of varistors reaching a threshold voltage value.

3. An arrangement according to claim 1, wherein the heater arrangement comprises a plurality of heaters, wherein each heater of the plurality of heaters is positioned for applying heat to a respective one of the plurality of magnet sections.

4. An arrangement according to claim 1, wherein the heater arrangement is configured to generate heat to be applied to each of the plurality of magnet sections by way of Joule heating as a result of the voltage change across the said one or more of the plurality of varistors.

5. An arrangement according to claim 1, wherein each varistor component is formed as a disc, and for each of one or more varistors that comprise two or more of the said varistor components, the varistor components are arranged in a stack.

6. An arrangement according to claim 1, further comprising an active quench protection system that comprises:
    a quench detector module configured to detect a quench occurring in one or more of the plurality of magnet sections based upon a voltage across one or more of the plurality of varistors reaching a predetermined quench threshold voltage value; and
    a quench inducer system configured to effect a quench condition in one or more of the plurality of magnet sections in response to the quench detector module detecting a quench occurring.

7. An arrangement according to claim 6, configured such that a quench occurring in one or more of the plurality of magnet sections while the magnitude of the electrical current through the magnet sections is less than 50% of a predetermined current value corresponding to an operating current of the magnet causes the voltage across the one or more of the plurality of varistors to reach the predetermined quench threshold voltage value.

8. An arrangement according to claim 1, wherein the superconducting magnet sections comprise at least one Low Temperature Superconductor, LTS, magnet section and at least one High Temperature Superconductor, HTS, magnet section, and wherein the quench protection arrangement comprises an HTS quench protection system adapted to apply quench protection to each of the at least one HTS magnet section in response to a voltage across any one or more of the plurality of varistors reaching a threshold voltage value.

9. An arrangement according to claim 8, wherein HTS quench protection system is adapted to apply the quench protection by way of any one or more of: causing energy to be dissipated from the at least one HTS magnet section to a body external to the magnet; and applying an alternating current having a predetermined frequency and magnitude configured to cause Joule heating within a coil of the at least one HTS magnet section.

10. An arrangement according to claim 1, wherein each of the plurality of varistors comprises silicon carbide.

11. An arrangement according to claim 1, wherein the heater arrangement is associated with the plurality of varistors such that, when a quench occurs in one of the plurality of magnet sections, a resulting voltage across the said varistor causes the heating arrangement to provide heat to at least one further magnet section of the plurality of magnet sections.

12. A method of protecting a superconducting magnet comprising a plurality of magnet sections in which each of a plurality of varistors is electrically connected in parallel across a respective one of the plurality of magnet sections, one or more of the plurality of varistors each comprises two or more varistor components, and a heater arrangement is electrically connected to the plurality of varistors, the method comprising applying heat to each of the plurality of magnet sections in response to a change in a voltage across any one or more of the plurality of varistors.

* * * * *